US012648267B2

(12) United States Patent
Hsu et al.

(10) Patent No.: US 12,648,267 B2
(45) Date of Patent: Jun. 2, 2026

(54) LIGHT-EMITTING DIODE DISPLAY AND MANUFACTURING METHOD OF THE SAME

(71) Applicant: AUO Corporation, Hsin-Chu (TW)

(72) Inventors: Yi-Yueh Hsu, Hsin-Chu (TW);
Kuan-Hsun Chen, Hsin-Chu (TW);
Hsin-Ni Yang, Hsin-Chu (TW);
Wei-Lung Liau, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 553 days.

(21) Appl. No.: 18/091,438

(22) Filed: Dec. 30, 2022

(65) Prior Publication Data

US 2023/0261147 A1 Aug. 17, 2023

(30) Foreign Application Priority Data

Feb. 16, 2022 (TW) ................................. 111105699

(51) Int. Cl.
| | |
|---|---|
| *H10H 20/84* | (2025.01) |
| *H10H 20/01* | (2025.01) |
| *H10H 20/852* | (2025.01) |
| *H10W 90/00* | (2026.01) |

(52) U.S. Cl.
CPC ............ *H10H 20/84* (2025.01); *H10H 20/01* (2025.01); *H10H 20/852* (2025.01); *H10W 90/00* (2026.01); *H10H 20/0362* (2025.01)

(58) Field of Classification Search
None
See application file for complete search history.

(56) References Cited

U.S. PATENT DOCUMENTS

| | | | | |
|---|---|---|---|---|
| 10,504,878 | B2 | 12/2019 | Min et al. | |
| 2009/0017566 | A1* | 1/2009 | Basin ................... | H10H 20/018 |
| | | | | 257/E33.059 |
| 2012/0261689 | A1* | 10/2012 | Appelt ................ | H10H 20/857 |
| | | | | 257/E33.059 |
| 2016/0260873 | A1* | 9/2016 | Yamada ............... | H10H 20/854 |

(Continued)

FOREIGN PATENT DOCUMENTS

| | | |
|---|---|---|
| CN | 109844948 A | 6/2019 |
| CN | 110183979 A | 8/2019 |
| TW | 202133386 A | 9/2021 |

OTHER PUBLICATIONS

Office Action issued by the State Intellectual Property Office of the Peoples Republic of China on Aug. 30, 2024, for Application No. 202210701017.4, China.

(Continued)

*Primary Examiner* — Bilkis Jahan
(74) *Attorney, Agent, or Firm* — Tim Tingkang Xia, Esq.; Troutman Pepper Locke LLP

(57) ABSTRACT

A light-emitting diode display includes a substrate, multiple light-emitting diodes, an under fill, and an encapsulant. The light-emitting diodes are disposed on the substrate. The under fill is disposed between the substrate and the light-emitting diodes. The under fill includes multiple portions, and the portions are respectively located between two adjacent ones of the light-emitting diodes. A height of at least one of the portions is different from the heights of the other portions. The encapsulant is disposed on the under fill and the light-emitting diodes.

12 Claims, 12 Drawing Sheets

10

(56) References Cited

U.S. PATENT DOCUMENTS

| | | | |
|---|---|---|---|
| 2018/0033926 A1* | 2/2018 | Nonogawa | H10H 20/853 |
| 2018/0047863 A1* | 2/2018 | Jeon | B32B 17/10036 |
| 2018/0212106 A1* | 7/2018 | Chien | H10H 20/062 |
| 2018/0277725 A1* | 9/2018 | Xiong | H10H 20/8512 |
| 2019/0006554 A1* | 1/2019 | Kususe | H10H 20/0137 |
| 2019/0114958 A1 | 4/2019 | Shin et al. | |
| 2019/0237444 A1 | 8/2019 | Steckel et al. | |
| 2020/0135126 A1 | 4/2020 | Yokoyama et al. | |
| 2020/0274039 A1 | 8/2020 | Chen et al. | |

OTHER PUBLICATIONS

Office Action issued by (TIPO) Intellectual Property Office Ministry of Economic Affairs R.O.C. on Jan. 12, 2023 for Application No. 111105699, Tawian.

* cited by examiner

FIG. 3E

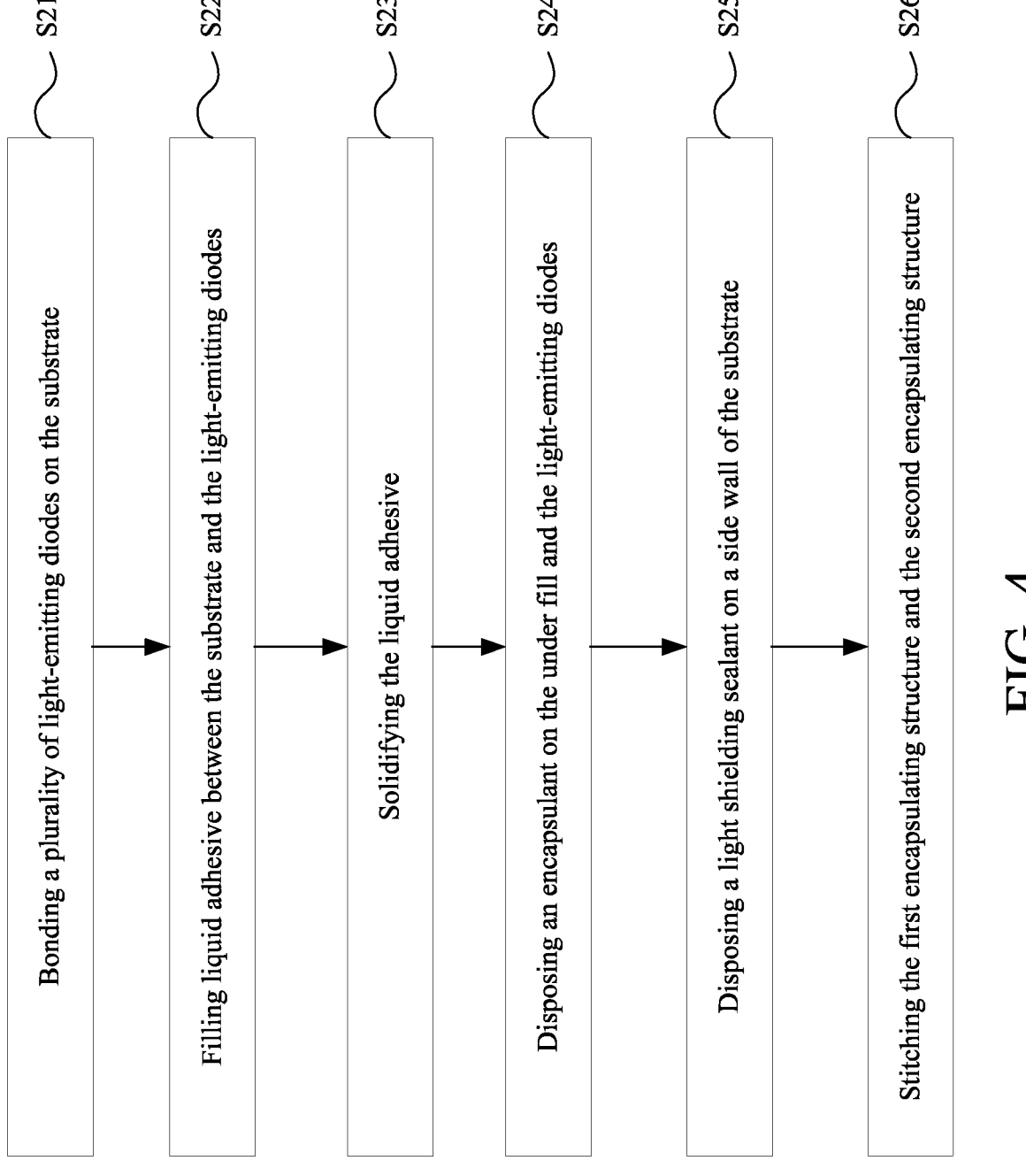

S21 — Bonding a plurality of light-emitting diodes on the substrate

S22 — Filling liquid adhesive between the substrate and the light-emitting diodes S23 — Solidifying the liquid adhesive S24 — Disposing an encapsulant on the under fill and the light-emitting diodes S25 — Disposing a light shielding sealant on a side wall of the substrate S26 — Stitching the first encapsulating structure and the second encapsulating structure

LIGHT-EMITTING DIODE DISPLAY AND MANUFACTURING METHOD OF THE SAME

CROSS-REFERENCE TO RELATED PATENT APPLICATION

This non-provisional application claims priority to and the benefit of, pursuant to 35 U.S.C. § 119(a), patent application Ser. No. 111105699 filed in Taiwan on Feb. 16, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a light-emitting diode display and a manufacturing method of the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing manufacturing method of the light-emitting diode encapsulating structure is the flip-chip eutectic technology. After the light-emitting diodes are bonded on the substrate, the encapsulant sealing process is then performed. However, the laminating procedure in the sealing process causes the light-emitting diodes located at the edges or corners of the substrate to shift or fail. Thus, the stitching locations of the stitched display become apparent.

In the existing technology, the thickness of the light shielding layer disposed on the substrate is not conducive to the bonding process of the light-emitting diodes. If the light shielding layer avoids the peripheral area of the light-emitting diodes, the metal lines of the substrate become reflective and affect the display effect of the display.

In view of this, a heretofore unaddressed need to provide a light-emitting diode display exists in the art to address the aforementioned deficiencies and inadequacies.

SUMMARY

One aspect of the present disclosure is directed to a light-emitting diode display.

In one embodiment, the light-emitting diode display includes a substrate, a plurality of light-emitting diodes, an under fill and an encapsulant. The light-emitting diodes are disposed on the substrate. The under fill is disposed between the substrate and the light-emitting diodes. The under fill includes a plurality of portions, where the portions are located between two adjacent ones of the light-emitting diodes respectively, and a height of at least one of the portions is different from heights of other ones of the portions. The encapsulant is disposed on the under fill and the light-emitting diodes.

In one embodiment, a distance exists between two adjacent ones of the light-emitting diodes, and when the distance between the two adjacent ones of the light-emitting diodes is greater, a height of a corresponding one of the portions of the under fill is lower.

In one embodiment, an upper surface of the under fill is arc-shaped.

In one embodiment, each of the light-emitting diodes has a height, and a maximum height of roughness (Rz) of the under fill is less than 15% of the height.

In one embodiment, a permeability of the under fill is less than 1%.

In one embodiment, the substrate has a side wall, and the light-emitting diode display further comprises: a light shielding sealant, disposed on the side wall of the substrate.

In one embodiment, a permeability of the light shielding sealant is less than 1% and is greater than 0.1%.

In one embodiment, the encapsulant and the side wall of the substrate are separated by the light shielding sealant.

In one embodiment, an upper surface of the light shielding sealant is higher than an upper surface of the substrate.

Another aspect of the present disclosure is directed to a manufacturing method of a light-emitting diode display.

In one embodiment, the manufacturing method of the light-emitting diode includes forming a first encapsulating structure, and forming the first encapsulating structure includes: bonding a plurality of light-emitting diodes on a substrate; filling a liquid under fill between the substrate and the light-emitting diodes; solidifying the liquid under fill to form a solidified under fill; and disposing an encapsulant on the solidified under fill and the light-emitting diodes.

In one embodiment, a distance exists between two adjacent ones of the light-emitting diodes, and the step of filling the liquid under fill between the substrate and the light-emitting diodes further includes: when the distance between the light-emitting diodes is greater, a height of the liquid under fill between the two adjacent ones of the light-emitting diodes is lower.

In one embodiment, the step of filling the liquid under fill is performed by dispensing, pattern spraying or screen printing.

In one embodiment, the step of disposing the encapsulant is performed by laminating.

In one embodiment, the manufacturing method of the light-emitting diode further includes: forming a second encapsulating structure; and stitching the first encapsulating structure and the second encapsulating structure.

In one embodiment, the manufacturing method of the light-emitting diode further includes: prior to stitching the first encapsulating structure and the second encapsulating structure, disposing a light shielding sealant on a side wall of the substrate.

In the aforementioned embodiments, by disposing the liquid under fill between the substrate and the light-emitting diodes, and not performing the laminating process prior to solidifying the under fill, the light-emitting diodes may be prevented from shifting or failing. The liquid under fill may fill the gaps between the substrate and the light-emitting diodes, so the solidified under fill may stabilize the bonding strength between the substrate and the light-emitting diodes. Further, the under fill is an opaque material, which may prevent the metal lines from being reflective, such that the stitching locations of the light-emitting diode display become not so apparent, thus enhancing the yield and display quality of the light-emitting diode display.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 3A to FIG. 3E are sectional views of the intermediate steps of the manufacturing method of the light-emitting diode in FIG. 2.

FIG. 4 is a flowchart of a manufacturing method of a light-emitting diode display according to another embodiment of the present disclosure.

DETAILED DESCRIPTION

Figure 1:
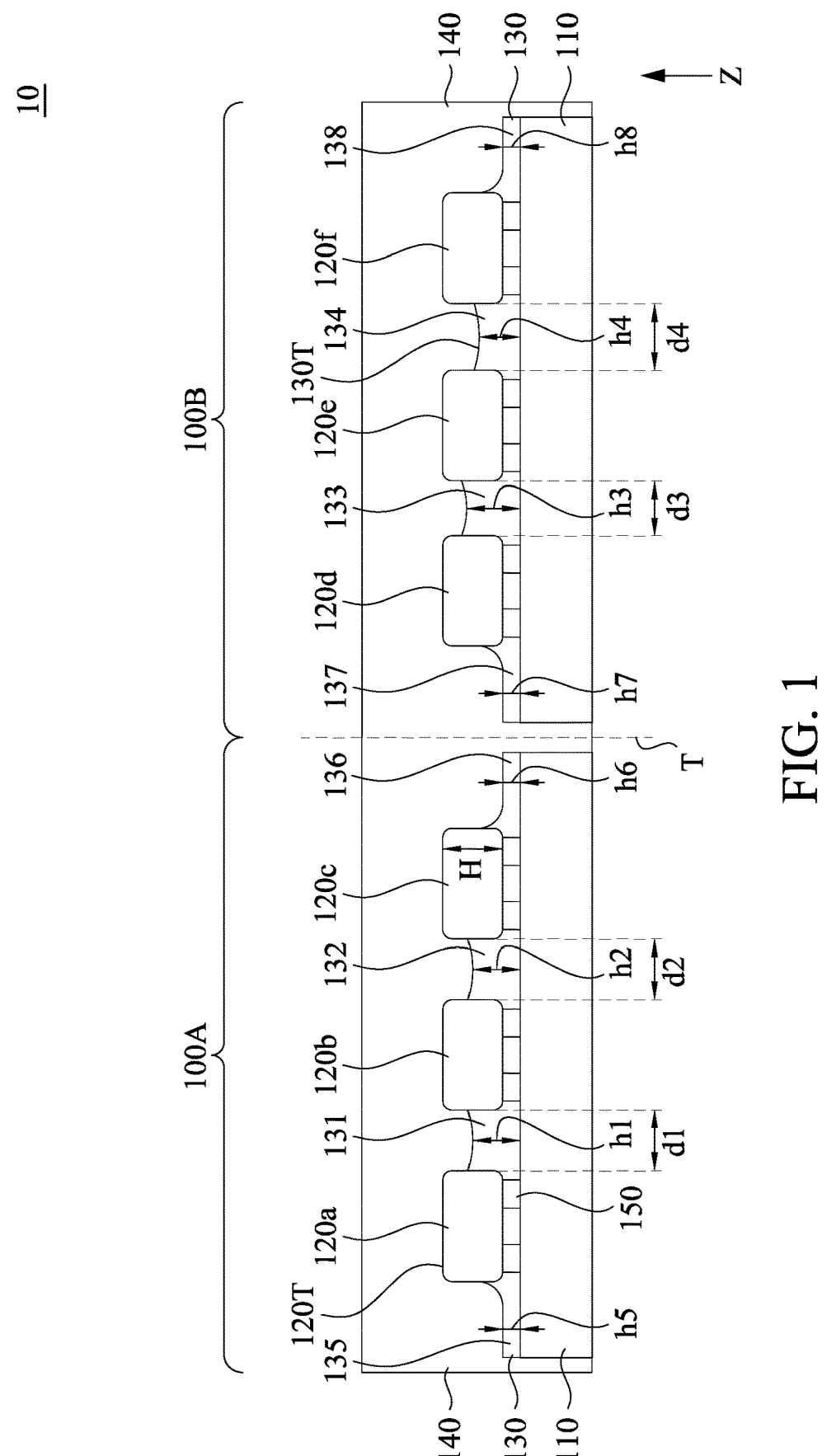
FIG. 1 is a sectional view of a light-emitting diode display according to one embodiment of the present disclosure.

The detailed features and advantages of the present disclosure are described below in great detail through the following embodiments, and the content of the detailed description is sufficient for persons skilled in the art to understand the technical content of the present invention and to implement the present invention there accordingly. In other words, in certain embodiments of the present disclosure, the detailed implementation may be unnecessary. For clarity purposes, the thicknesses of layers and areas in the drawings may be exaggerated, and identical reference characters are used to indicate identical components in the description of the drawings.

FIG. 1 is a sectional view of a light-emitting diode display 10 according to one embodiment of the present disclosure. The light-emitting diode display 10 may be a micro light-emitting diode (micro LED) display or a mini LED display. The light-emitting diode display 10 is formed by stitching a first encapsulating structure 100A and a second encapsulating structure 100B. The first encapsulating structure 100A and the second encapsulating structure 100B have substantially identical components.

The first encapsulating structure 100A includes a substrate 110, a plurality of light-emitting diodes 120a, 120b, 120c, an under fill 130 and an encapsulant 140. The light-emitting diodes 120a, 120b, 120c are disposed on the substrate 110. The under fill 130 is disposed between the substrate 110 and the light-emitting diodes 120a, 120b, 120c. The encapsulant 140 is disposed on the under fill 130 and the light-emitting diodes 120a, 120b, 120c. The second encapsulating structure 110B includes a substrate 110, a plurality of light-emitting diodes 120d, 120e, 120f, an under fill 130 and an encapsulant 140. The under fill 130 is disposed between the substrate 110 and the light-emitting diodes 120d, 120e, 120f. The encapsulant 140 is disposed on the under fill 130 and the light-emitting diodes 120d, 120e, 120f.

The light-emitting diodes 120a, 120f are bonded on the substrate 110 by bonding members 150. The under fill 130 partially surrounds the light-emitting diodes 120a, 120f. In other words, a height of the under fill 130 exceeds heights of the bonding members 150 and is lower than top portions 120T of the light-emitting diodes 120a, 120f Thus, the under fill 130 may stabilize the bonding strength of the light-emitting diodes 120a, 120f and the substrate 110, preventing the light-emitting diodes 120a-120f from shifting or failing in the subsequent manufacturing process.

From the sectional viewing angle, the under fill 130 of the first encapsulating structure 100A includes a plurality of portions 131, 132, 135, 136. The portions 131, 132, 135, 136 are substantially integrally formed, and are divided into a plurality of portions from the sectional viewing angle for description purposes. The portion 131 of the under fill 130 is located between adjacent light-emitting diodes 120a, 120b, and the portion 132 of the under fill 130 is located between adjacent light-emitting diodes 120b, 120c. The portions 135, 136 of the under fill 130 are located at the edges of the first encapsulating structure 100A, where the portion 136 is located between the light-emitting diode 120c and the light-emitting diode 120d.

The under fill 130 of the light-emitting diode display 10 is a liquid when being disposed between the light-emitting diodes 120a-120f and the substrate 110, and is then solidified to stabilize the light-emitting diodes 120a-120f. Thus, the under fill 130 is not performed with the laminating process prior to being solidified, thereby preventing the light-emitting diodes 120a-120f located at the edges and corners of the first encapsulating structure 100A from shifting or failing due to being pressed. With such design, a height of at least one of the portions 131, 132, 135, 136 is different from heights of the other portions. For example, in the present embodiment, the heights h1, h2 of the portions 131, 132 are greater than the heights h5, h6 of the portions 135, 136.

Similarly, the under fill 130 of the second encapsulating structure 100B includes a plurality of portions 133, 134, 137, 138. The portion 133 of the under fill 130 is located between adjacent light-emitting diodes 120d, 120e, and the portion 134 of the under fill 130 is located between adjacent light-emitting diodes 120e, 120f. The portions 137, 138 of the under fill 130 are located at the edges of the second encapsulating structure 100B, where the portion 137 is located between the light-emitting diode 120d and the light-emitting diode 120c. The heights h3, h4 of the portions 133, 134 are greater than the heights h7, h8 of the portions 137, 138.

Specifically, when a distance between two adjacent ones of the light-emitting diodes 120a-120f is greater, the height of the corresponding one of the portions 131-138 is lower. For example, in the present embodiment, a distance d1 exists between the light-emitting diode 120a and the light-emitting diode 120b, and a distance d2 exists between the light-emitting diode 120b and the light-emitting diode 120c. The distance d1 and the distance d2 are substantially equal, and the heights h1, h2 of the corresponding portions 131, 132 are substantially equal. A distance d3 exists between the light-emitting diode 120d and the light-emitting diode 120e, and a distance d4 exists between the light-emitting diode 120e and the light-emitting diode 120f. The distance d4 is greater than the distance d3, and the height h3 of the corresponding portion 133 is greater than the height h4 of the portion 134.

Since the under fill 130 is a liquid when being disposed between the light-emitting diodes 120a-120f and the substrate 110, and the under fill 130 is not performed with the laminating process prior to being solidified, an upper surface 130T of the under fill 130 is arc-shaped. For example, the upper surface 130T of the portions 131, 132, 133, 134 of the under fill 130 is in an arc shape recessed downward, and the portions 135, 136, 137, 138 are in an arc shape gradually flattened. In other words, the heights h5, h6 h7, h8 of the portions 135, 136, 137, 138 are less than the heights h1-h4.

The light-emitting diodes 120a-120f have a height H, and a maximum height of roughness (Rz) of the under fill 130 is less than 15% of the height H of the light-emitting diodes 120a-120f. The maximum height of roughness is defined as a height different of the surface of the under fill 130 in the vertical direction Z. In other words, compared to a surface through an etching process, the surface of the under fill 130 is more smooth. For example, the height H of the light-emitting diodes 120a-120f is about 10 μm, and the maximum height of roughness of the under fill 130 is less than 1.5 μm, but the present disclosure is not limited thereto.

The material of the under fill 130 is an opaque material, such as a resin, a color resist, etc. A permeability of the under fill 130 is less than 1%, so the under fill 130 may have the effect of preventing the metal lines of the substrate 110 from being reflective. A permeability of the encapsulant 140 is greater than 50%, but the present disclosure is not limited thereto.

According to the foregoing disclosure, since the under fill 130 is a liquid when being disposed between the light-emitting diodes 120a-120f and the substrate 110, and the under fill 130 is not performed with the laminating process prior to being solidified, the light-emitting diodes 120a-120f located at the edges and corners of the first encapsulating structure 100A may be prevented from shifting or failing due to being pressed. Thus, the stitching location T between the first encapsulating structure 100A and the second encapsulating structure 100B may become not so apparent, thus enhancing the yield and the display quality of the light-emitting diode display 10.

Figure 2:
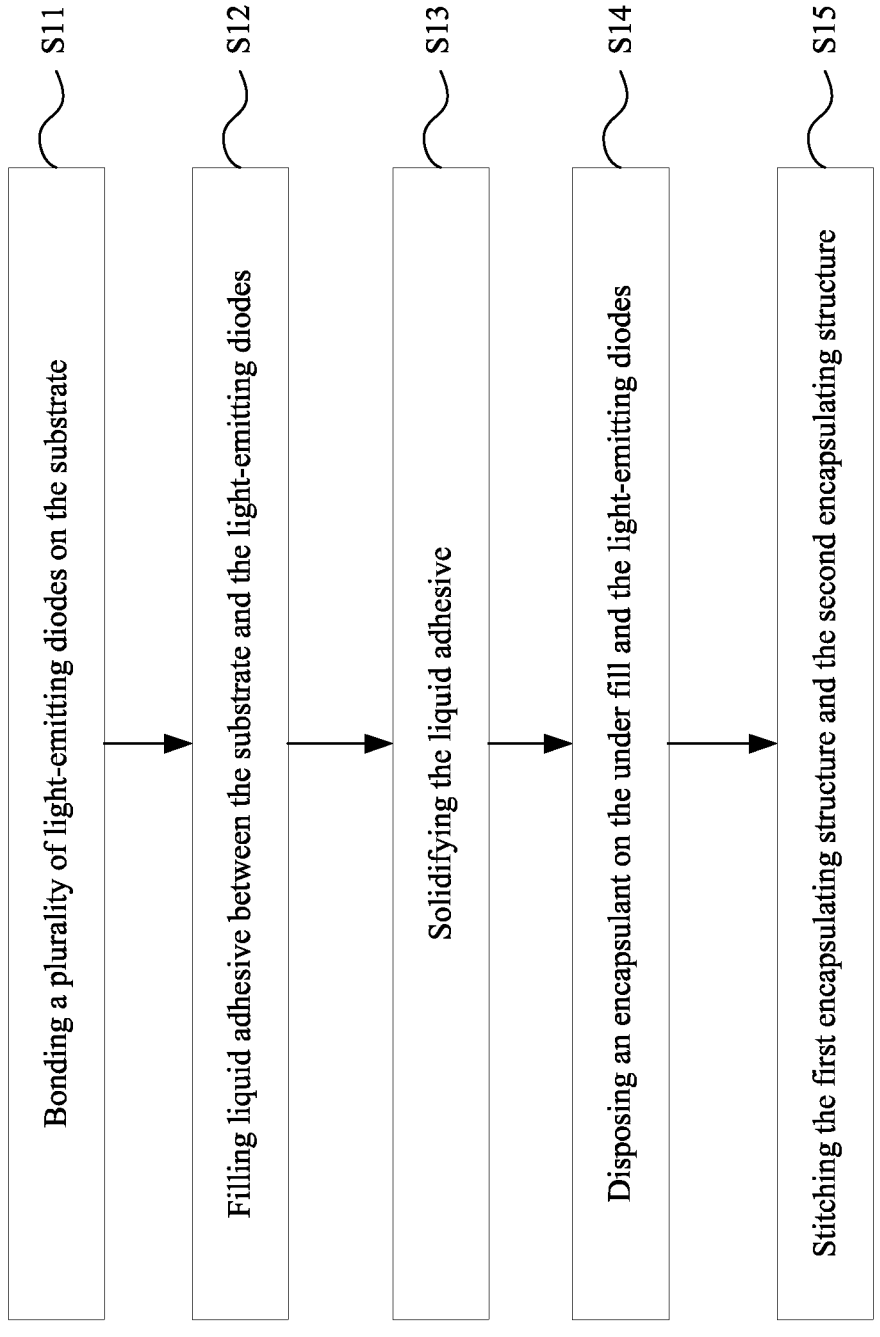
FIG. 2 is a flowchart of a manufacturing method of a light-emitting diode display according to one embodiment of the present disclosure.

FIG. 2 is a flowchart of a manufacturing method of a light-emitting diode display according to one embodiment of the present disclosure. The present embodiment uses the light-emitting diode display 10 in FIG. 1 as an example. FIG. 3A to FIG. 3E are sectional views of the intermediate steps of the manufacturing method of the light-emitting diode in FIG. 2.

Figure 3A:
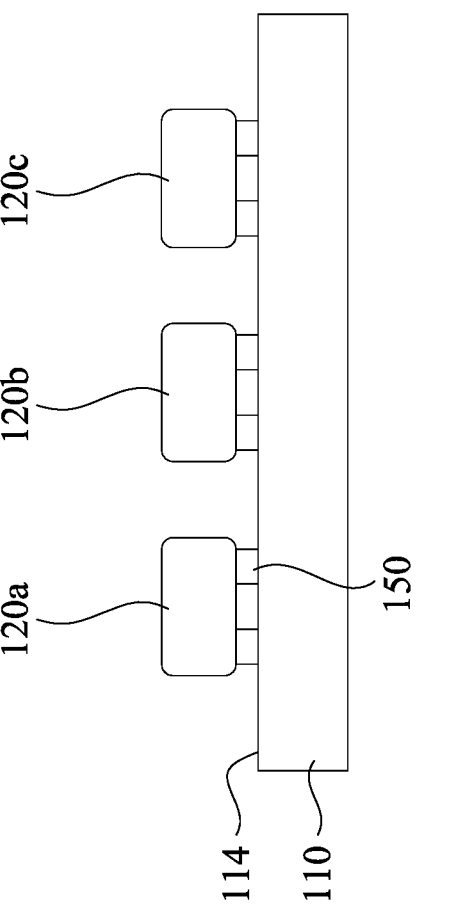

Referring to the step S11 of FIG. 2 and FIG. 3A, in the step S11, a plurality of light-emitting diodes 120a-120c are bonded on the substrate 110. The light-emitting diodes 120a-120c may be bonded on the substrate 110 by mass transfer, and the light-emitting diodes 120a-120c are electrically connected to the metal lines (not shown) in the substrate 110 through the bonding members 150. In the step S11, when the light-emitting diodes 120a-120c are bonded on the substrate 110, an upper surface 114 of the substrate 110 is not disposed with a light shielding material. In other words, the bonding effect of the light-emitting diodes 120a-120c is not affected by the thickness of the light shielding material on the substrate 110.

Figure 3B:
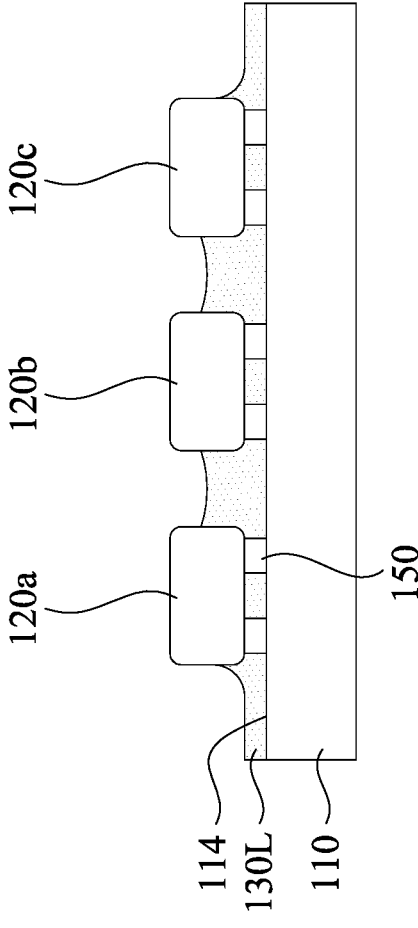

Referring to the step S12 of FIG. 2 and FIG. 3B, in the step S12, the liquid under fill 130L is filled between the substrate 110 and the light-emitting diodes 120a-120c. The step of filling the liquid under fill 130L may be performed by dispensing, pattern spraying or screen printing. The liquid under fill 130L may fill the gaps between the bonding members 150 and the gaps between the substrate 110 and the light-emitting diodes 120a-120c. In other words, the liquid under fill 130L may cover the upper surface 114 of the substrate 110, and the liquid under fill 130L further partially covers the light-emitting diodes 120a-120c.

Figure 3C:
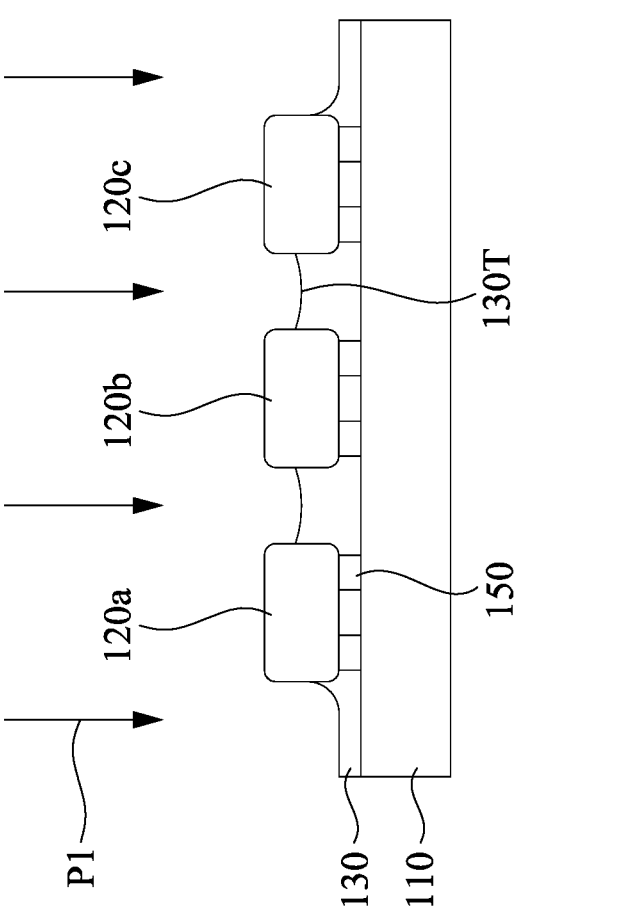

Referring to the step S13 of FIG. 2, FIG. 3B and FIG. 3C, in the step S13, the liquid under fill 130L is solidified to form the under fill 130, which is performed by, for example, ultraviolet solidifying P1. Since the liquid under fill 130L is not performed with the laminating process prior to being solidified, the light-emitting diodes 120a-120f located at the edges and corners of the first encapsulating structure 100A may be prevented from shifting or failing due to being pressed. Further, the liquid under fill 130L may fill the gaps between the substrate 110, the light-emitting diodes 120a-120c, and the bonding members 150, so the under fill 130 after being solidified may stabilize the bonding strength of the light-emitting diodes 120a-120c and the substrate 110. As disclosed above, the under fill 130 after being solidified has an arc-shaped upper surface 130T, and the under fill 130 has different heights according to the different distances between the light-emitting diodes 120a-120c. The under fill 130 is an opaque material, such as a resin, a color resist, etc., so the under fill 130 may prevent the metal lines of the substrate 110 from being reflective.

Figure 3D:
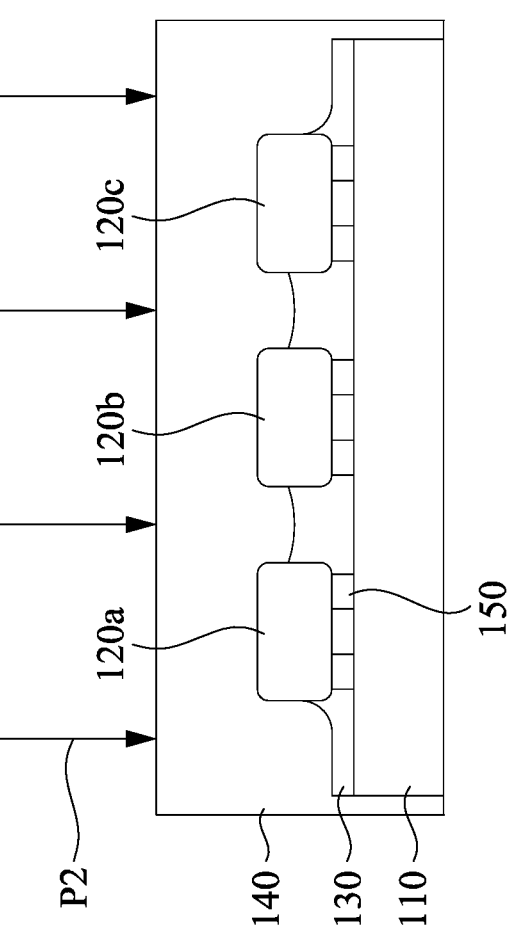

Referring to the step S14 of FIG. 2 and FIG. 3D, in the step S14, the encapsulant 140 is disposed on the under fill 130 and the light-emitting diodes 120a-120c. The encapsulant 140 is disposed on the under fill 130 by laminating P2, and the encapsulant 140 is then performed with heat curing. In the step S14, the under fill 130 is solidified, and the under fill 130 partially surrounds the light-emitting diodes 120a-120c. Thus, the under fill 130 may stabilize the light-emitting diodes 120a-120c in the laminating process of the step S14, preventing the light-emitting diode 120a or the light-emitting diode 120c located at the edges and corners of the first encapsulating structure 100A from shifting or failing due to being pressed.

Figure 3E:
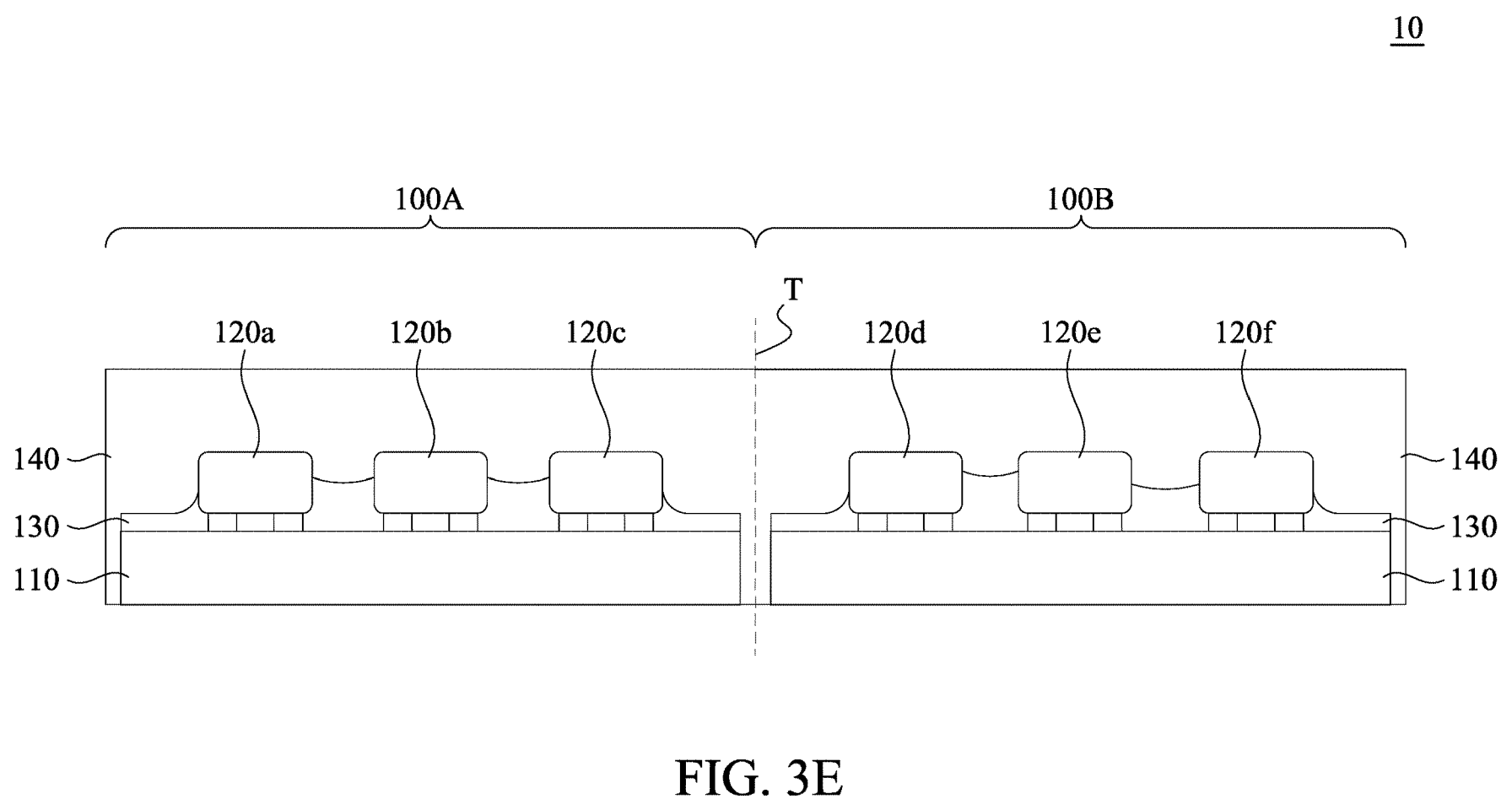

Referring to the step S15 of FIG. 2 and FIG. 3E, in the step S15, the first encapsulating structure 100A and the second encapsulating structure 100B are stitched. The second encapsulating structure 100B may be formed by the steps S11 to S14. As shown in FIG. 3E, the under fill 130 may stabilize the light-emitting diodes 120a-120c and prevent from failing, and the under fill 130 may have the effect of the preventing the metal lines from being reflective. Thus, the stitching location T between the first encapsulating structure 100A and the second encapsulating structure 100B may become not so apparent, thus enhancing the yield and the display quality of the light-emitting diode display 10.

Figure 5A:
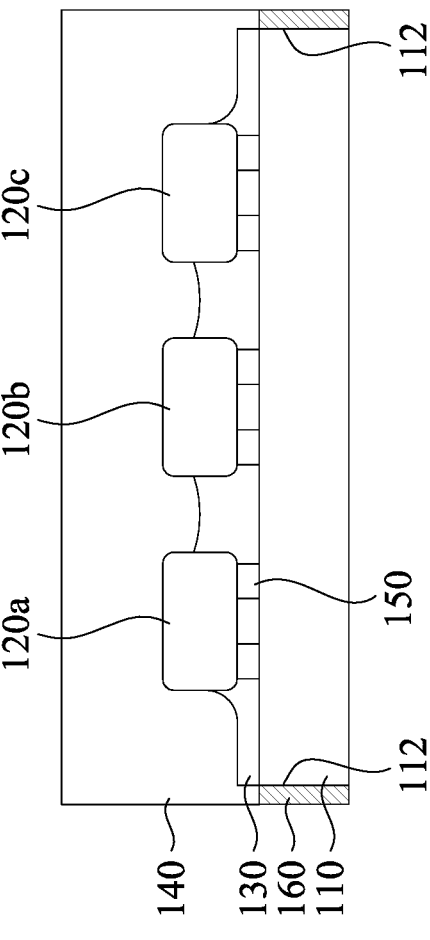
FIG. 5A to FIG. 5B are sectional views of the intermediate steps of the manufacturing method of the light-emitting diode in FIG. 4.
Figure 5B:
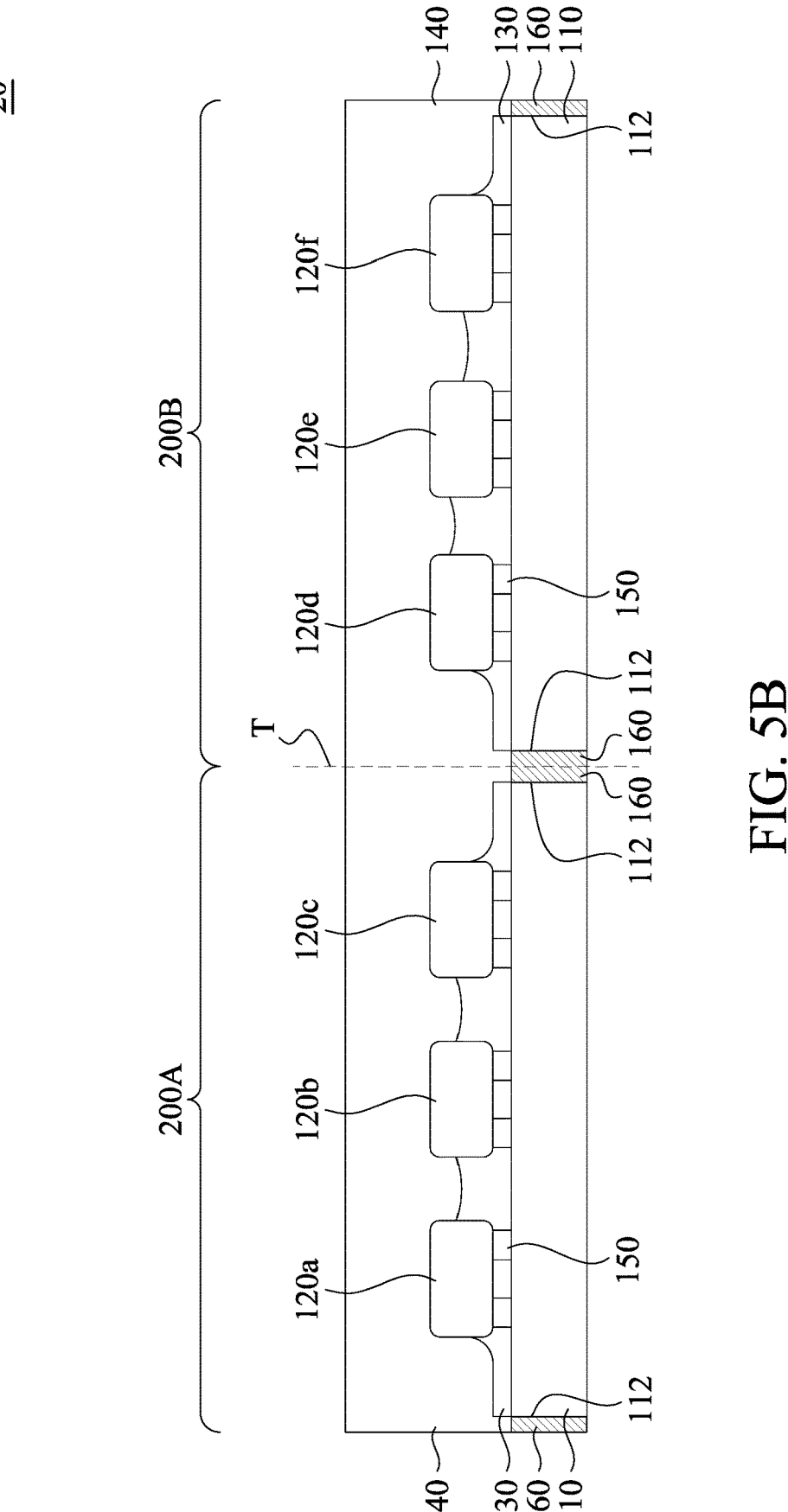

FIG. 4 is a flowchart of a manufacturing method of a light-emitting diode display according to another embodiment of the present disclosure. FIG. 5A to FIG. 5B are sectional views of the intermediate steps of the manufacturing method of the light-emitting diode in FIG. 4. As shown in FIG. 4, the manufacturing method in the present embodiment includes steps S21~S26, where the steps S21~S24 are identical to the steps S11~S14. Thus, the steps S25~S26 are hereinafter described, and the descriptions of the steps S21~S24 are omitted.

Referring to the step S25 of FIG. 4 and FIG. 5A, in the present embodiment, the first encapsulating structure 200A is formed according to the steps S21~S24. The first encapsulating structure 200A is substantially identical to the first encapsulating structure 100A as shown in FIG. 3D, and the differences exist in that the first encapsulating structure 200A further includes a light shielding sealant 160. The light shielding sealant 160 is disposed on the two side walls 112 of the substrate 110. In the present embodiment, the light shielding sealant 160 covers the whole side wall 112. In other words, in the present embodiment, the encapsulant 140 and the side wall 112 of the substrate 110 are separated by the light shielding sealant 160, and the encapsulant 140 does not extend to the side wall 112, but the present disclosure is not limited thereto. A permeability of the light shielding sealant 160 is less than 1%.

Referring to the step S26 of FIG. 4 and FIG. 5A, in the step S26, the first encapsulating structure 200A and the second encapsulating structure 200B are stitched to form the light-emitting diode display 20. The first encapsulating structure 200A and the second encapsulating structure 200B may be formed by the steps S21 to S25. Since the encapsulant 140 may reflect light, the light shielding sealant 160 may absorb the light reflected by the encapsulant 140, such that the stitching location T may further become not so apparent, thus enhancing the yield and the display quality of the light-emitting diode display 20. In the present embodiment, the permeability of the encapsulant 140 may be greater than 90%, and the light shielding sealant 160 absorbs the reflected light of the encapsulant 140, such that the stitching location T may become not so apparent.

Figure 6:
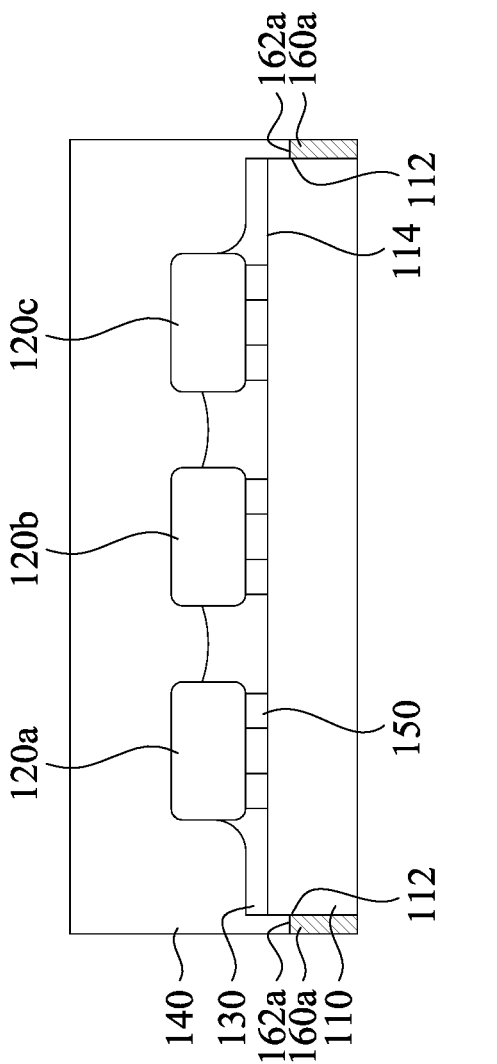
FIG. 6 is a sectional view of a light-emitting diode encapsulating structure according to one embodiment of the present disclosure.

FIG. 6 is a sectional view of an encapsulating structure 300 according to one embodiment of the present disclosure. The encapsulating structure 300 is substantially identical to the first encapsulating structure 200A as shown in FIG. 5A, and the differences exist in that the light shielding sealant 160a of the encapsulating structure 300 covers only a portion of the side wall 112, that is, the encapsulant 140 covers the other portion of the side wall 112. In other words, in this embodiment, an upper surface 162a of the light shielding sealant 160a is lower than an upper surface 114 of the substrate 110. The encapsulating structure 300 has identical technical effects to those of the first encapsulating structure 200A, and is not hereinafter elaborated.

Figure 7:
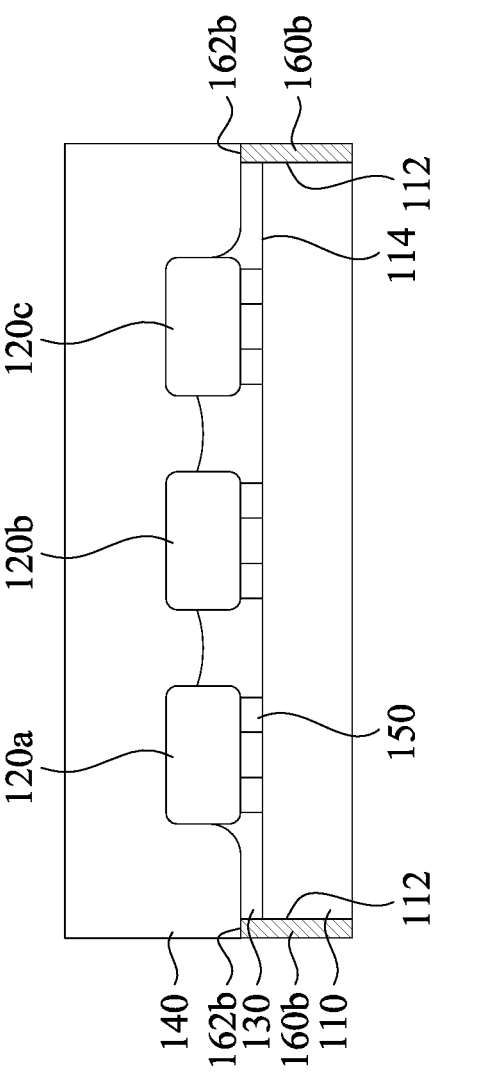
FIG. 7 is a sectional view of a light-emitting diode encapsulating structure according to one embodiment of the present disclosure.

FIG. 7 is a sectional view of an encapsulating structure 400 according to one embodiment of the present disclosure. The encapsulating structure 400 is substantially identical to the encapsulating structure 300 as shown in FIG. 6, and the differences exist in that an upper surface 162b of the light shielding sealant 160b of the encapsulating structure 400 is higher than an upper surface 114 of the substrate 110. In other words, the light shielding sealant 160b covers the whole side wall 112 of the substrate 110 and covers the side wall of a portion of the under fill 130. In other embodiments, the light shielding sealant 160b may cover the side wall 112 of the whole under fill 130. The encapsulating structure 400 has identical technical effects to those of the encapsulating structure 300, and is not hereinafter elaborated.

In sum, in the light-emitting diode display according to the embodiments of the present disclosure, by disposing the liquid under fill between the substrate and the light-emitting diodes, and not performing the laminating process prior to solidifying the under fill, the light-emitting diodes may be prevented from shifting or failing. The liquid under fill may fill the gaps between the substrate and the light-emitting diodes, so the solidified under fill may stabilize the bonding strength between the substrate and the light-emitting diodes. Further, the under fill is an opaque material, which may prevent the metal lines from being reflective, such that the stitching locations of the light-emitting diode display become not so apparent, thus enhancing the yield and display quality of the light-emitting diode display.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light-emitting diode display, comprising:
a substrate, having a side wall;
a plurality of light-emitting diodes, disposed on the substrate;
a light shielding sealant, disposed on the side wall of the substrate;
an under fill, disposed between the substrate and the light-emitting diodes, wherein the under fill comprises a plurality of portions, the portions are correspondingly located between two adjacent ones of the light-emitting diodes respectively, and a height of at least one of the portions located between two corresponding adjacent ones of the light-emitting diodes is different from a height of another one of the portions located between another two corresponding adjacent ones of the light-emitting diodes; and
an encapsulant, disposed on the under fill and the light-emitting diodes.

2. The light-emitting diode display according to claim 1, wherein a distance exists between two adjacent ones of the light-emitting diodes, and when the distance between the two adjacent ones of the light-emitting diodes is greater, a height of a corresponding one of the portions of the under fill is lower.

3. The light-emitting diode display according to claim 1, wherein an upper surface of the under fill is arc-shaped.

4. The light-emitting diode display according to claim 1, wherein each of the light-emitting diodes has a height, and a maximum height of roughness (Rz) of the under fill is less than 15% of the height.

5. The light-emitting diode display according to claim 1, wherein a permeability of the under fill is less than 1%.

6. The light-emitting diode display according to claim 1, wherein a permeability of the light shielding sealant is less than 1%.

7. The light-emitting diode display according to claim 1, wherein the encapsulant and the side wall of the substrate are separated by the light shielding sealant.

8. The light-emitting diode display according to claim 1, wherein an upper surface of the light shielding sealant is higher than an upper surface of the substrate.

9. A manufacturing method of a light-emitting diode display, comprising:
forming a first encapsulating structure, comprising:
bonding a plurality of light-emitting diodes on a substrate;

filling a liquid under fill between the substrate and the light-emitting diodes;

solidifying the liquid under fill to form a solidified under fill; and disposing an encapsulant on the solidified under fill and the light-emitting diodes;

wherein the solidified under fill is disposed between the substrate and the light-emitting diodes, the solidified under fill comprises a plurality of portions, the portions are correspondingly located between two adjacent ones of the light-emitting diodes respectively, and a height of at least one of the portions located between two corresponding adjacent ones of the light-emitting diodes is different from a height of another one of the portions located between another two corresponding adjacent ones of the light-emitting diodes;

forming a second encapsulating structure;

prior to stitching the first encapsulating structure and the second encapsulating structure, disposing a light shielding sealant on a side wall of the substrate; and stitching the first encapsulating structure and the second encapsulating structure.

10. The manufacturing method of the light-emitting diode display according to claim 9, wherein a distance exists between two adjacent ones of the light-emitting diodes, and the step of filling the liquid under fill between the substrate and the light-emitting diodes further comprises:

when the distance between the light-emitting diodes is greater, a height of the liquid under fill between the two adjacent ones of the light-emitting diodes is lower.

11. The manufacturing method of the light-emitting diode display according to claim 9, wherein the step of filling the liquid under fill is performed by dispensing, pattern spraying or screen printing.

12. The manufacturing method of the light-emitting diode display according to claim 9, wherein the step of disposing the encapsulant is performed by laminating.

\* \* \* \* \*